(12) United States Patent
Ye et al.

(10) Patent No.: US 12,176,017 B2
(45) Date of Patent: Dec. 24, 2024

(54) MULTI-LAYERED MAGNETIC RANDOM ACCESS MEMORY AND ELECTRONIC DEVICE

(71) Applicant: HUAWEI TECHNOLOGIES CO., LTD., Guangdong (CN)

(72) Inventors: Li Ye, Shanghai (CN); Wenjing Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 121 days.

(21) Appl. No.: 17/864,970

(22) Filed: Jul. 14, 2022

(65) Prior Publication Data

US 2022/0351767 A1 Nov. 3, 2022

Related U.S. Application Data

(63) Continuation of application No. PCT/CN2020/072335, filed on Jan. 15, 2020.

(51) Int. Cl.
*G11C 11/16* (2006.01)

(52) U.S. Cl.
CPC ...... *G11C 11/1697* (2013.01); *G11C 11/1655* (2013.01); *G11C 11/1657* (2013.01); *G11C 11/1673* (2013.01); *G11C 11/1675* (2013.01)

(58) Field of Classification Search
CPC ............ G11C 11/1697; G11C 11/1655; G11C 11/1657; G11C 11/1673; G11C 11/1675;
(Continued)

(56) References Cited

U.S. PATENT DOCUMENTS

2003/0123271 A1\* 7/2003 Iwata ............... B82Y 10/00
257/E27.005
2013/0075844 A1 3/2013 Miyano et al.
(Continued)

FOREIGN PATENT DOCUMENTS

CN 107104121 A 8/2017
CN 107251145 A 10/2017
(Continued)

OTHER PUBLICATIONS

Wang et al., "Progresses and Challenges of Spin Orbit Torque Driven Magnetization Switching and Application (Invited)," 2018 IEEE International Symposium on Circuits and Systems (ISCAS), May 4, 2018, 5 pages.
(Continued)

*Primary Examiner* — Jerome Leboeuf
(74) *Attorney, Agent, or Firm* — Fish & Richardson P.C.

(57) ABSTRACT

One example magnetic random access memory includes a plurality of structural units and a plurality of voltage control lines. The plurality of voltage control lines are in parallel with each other. Planes in which the plurality of structural units are located are in parallel with each other, and a plane in which each of the plurality of structural units is located is perpendicular to the plurality of voltage control lines. Each structural unit includes a multi-layer storage structure including multiple layers that are stacked in sequence. Each layer of the multi-layer storage structure includes an electrode line and a plurality of storage units disposed on the electrode line. Each of the plurality of storage units includes a magnetic tunnel junction. A first end of each storage unit is connected to the electrode line, and a second end of each storage unit is connected to one of the plurality of voltage control lines.

20 Claims, 7 Drawing Sheets

(58) Field of Classification Search
CPC ... G11C 11/1653; G11C 11/161; H10B 63/84; H10N 50/10
See application file for complete search history.

(56) References Cited

U.S. PATENT DOCUMENTS

| | | | |
|---|---|---|---|
| 2014/0016390 A1* | 1/2014 | Zhao | G11C 11/1675 365/63 |
| 2017/0084322 A1* | 3/2017 | Wang | G11C 7/065 |
| 2018/0122825 A1* | 5/2018 | Lupino | H01L 27/11898 |
| 2018/0151210 A1 | 5/2018 | Li et al. | |
| 2018/0277187 A1* | 9/2018 | Ikegami | G11C 11/1675 |
| 2019/0079701 A1 | 3/2019 | Rakshit et al. | |
| 2019/0214429 A1 | 7/2019 | Kim et al. | |
| 2021/0091304 A1* | 3/2021 | Endoh | H10N 50/85 |

FOREIGN PATENT DOCUMENTS

| | | |
|---|---|---|
| CN | 110164902 A | 8/2019 |
| CN | 110572593 A | 12/2019 |
| JP | 6258452 B1 | 1/2018 |
| JP | 6316474 B1 | 4/2018 |
| JP | 6545853 B1 | 7/2019 |

OTHER PUBLICATIONS

Zhang et al., "Spintronic Processing Unit Within Voltage-Gated Spin Hall Effect MRAMs," IEEE Transactions On Nanotechnology, vol. 18, May 6, 2019, 11 pages.
Yoda et al., "Voltage-Control Spintronics Memory (VoCSM) Having Potentials of Ultra-Low Energy-Consumption and High-Density," 2016 IEEE International Electron Devices Meeting (IEDM), Feb. 2, 2017, 4 pages.
Liu et al., "Gate Voltage Modulation of Spin-Hall-Torque-Driven Magnetic Switching," Materials Science, Sep. 5, 2012, 27 pages.
Wang et al., "Electric-Field-Assisted Switching in Magnetic Tunnel Junctions," Nature Materials, vol. 11, Jan. 2012, 5 pages.
International Search Report and Written Opinion in International Appln. No. PCT/CN2020/072335, mailed on Oct. 19, 2020, 17 pages (with English translation).
Extended European Search Report in European Appln No. 20914618.2, dated Apr. 12, 2023, 6 pages.

* cited by examiner

MULTI-LAYERED MAGNETIC RANDOM ACCESS MEMORY AND ELECTRONIC DEVICE

CROSS-REFERENCE TO RELATED APPLICATIONS

This application is a continuation of International Application No. PCT/CN2020/072335, filed on Jan. 15, 2020, the disclosure of which is hereby incorporated by reference in its entirety.

TECHNICAL FIELD

This application relates to the field of storage technologies, and in particular, to a magnetic random access memory and an electronic device.

BACKGROUND

Development of information technologies puts forward higher requirements on a storage medium. Compared with conventional semiconductor storage technologies, a magnetic random access memory (MRAM) uses magnetic tunnel junctions (MTJs) as storage units. Due to excellent features, for example, non-volatility of storage data, fast read/write speed, infinite erase/write life, and low read/write power consumption, the magnetic random access memory is considered as a high-density memory with a broad application prospect.

A core storage unit of the MRAM is the MTJ. Each MTJ includes a free layer, a potential barrier layer, and a reference layer. Different data may be written into the MTJ by changing a direction of a magnetic moment of the free layer (that is, the magnetic moment of the free layer of the MTJ is parallel or anti-parallel to a magnetic moment of the reference layer).

To improve a storage density of the MRAM, a possible manner is to develop a storage form of the MRAM from 2 dimensions (2D) to 3 dimensions (3D). FIG. 1 shows an MRAM including a 3D stacked storage array.

In the 3D storage array shown in FIG. 1, each storage unit includes the MTJ and a selector that are connected in series. When the selector is turned on, data may be written into the MTJ connected to the selector. One end of the storage unit is connected to a word line (WL), and the other end is connected to a bit line (BL). The data is written to the MTJ under a spin transfer torque (STT) effect. To be specific, an electron is spin-polarized when passing through the reference layer of the MTJ, and a status of the magnetic moment of the free layer is changed when the polarized electron passes through the free layer, to change a relative orientation (parallel arrangement or anti-parallel arrangement) of the magnetic moment between the free layer and the reference layer, and write the data. In an embodiment, a turn-on voltage of the selector may be between V and V/2. A manner of writing the data is: A voltage V is applied between the WL and the BL of the storage unit into which the data is to be written, to turn on the selector of the storage unit. Under an STT effect, the magnetic moment of the free layer of the MTJ is reversed when a generated current passes through the MTJ, and data 0 is written. When voltage polarity is changed (that is, a voltage −V is applied between the WL and the BL), a direction of current is changed, and data 1 is written. In a writing process, a small voltage, for example, V/2 or V/3, is applied between a WL and a BL corresponding to a storage unit into which the data is not to be written. The voltage is less than the turn-on voltage of the selector. Therefore, the selector is in an off state, and no current passes through the MTJ.

For the 3D stacked storage array shown in FIG. 1, in terms of a structure, the storage unit includes the MTJ and the selector that are connected in series. Due to an electrical property of the selector, the selector needs to match the MTJ. It is difficult to find the selector that matches the MTJ. In addition, in terms of a writing manner, when the data is written under the STT effect, because the current needs to pass through a junction region (that is, the potential barrier layer) of the MTJ, the MTJ is easily broken down, and therefore stability of the storage unit is decreased.

In conclusion, a 3D stacked storage array solution is urgently needed to improve the storage density of the MRAM and the stability of the storage unit.

SUMMARY

Embodiments of this application provide a magnetic random access memory and an electronic device, to improve a storage density of the magnetic random access memory.

According to a first aspect, an embodiment of this application provides a magnetic random access memory, where the magnetic random access memory includes a plurality of structural units and a plurality of voltage control lines. In the magnetic random access memory, each structural unit includes a multi-layer storage structure that is stacked in sequence. Each layer of the multi-layer storage structure includes an electrode line and a plurality of storage units disposed on the electrode line. Each storage unit includes a magnetic tunnel junction (MTJ). One end of each storage unit is connected to the electrode line, and the other end is connected to one of the plurality of voltage control lines.

According to the magnetic random access memory provided in the first aspect, each structural unit includes the multi-layer storage structure, to 3D stack the storage structure, and improve a storage density of the magnetic random access memory. Compared with a 3D stacked storage array shown in FIG. 1, a selector does not need to be used in the storage unit. Therefore, a structure of the storage unit is simpler. In addition, according to the magnetic random access memory provided in the first aspect, data may be written to the storage unit by using a spin-orbit torque (SOT) effect and a voltage-controlled magnetic anisotropy (VCMA) effect. To be specific, a bias voltage is applied to a voltage control line connected to the magnetic tunnel junction and the VCMA effect is used to change a critical reverse current density of the magnetic tunnel junction, and a current is supplied to an electrode line connected to the magnetic tunnel junction and the SOT effect is used to reverse a magnetic moment at a free layer, to write the data. Compared with a solution shown in FIG. 1, when the data is written, no current passes through a junction region (that is, a potential barrier layer) of the magnetic tunnel junction. Therefore, stability of the magnetic tunnel junction is higher. In addition, according to the magnetic random access memory provided in the first aspect, each storage unit includes a magnetic tunnel junction. Therefore, difficulty in preparing the storage unit can be greatly reduced, and the storage density of the magnetic random access memory can be improved.

In a possible design, the plurality of voltage control lines are parallel, planes in which the plurality of structural units are located are parallel, and a plane in which each structural unit is located is perpendicular to the plurality of voltage control lines.

In addition, in the magnetic random access memory provided in the first aspect, a resistance value of each magnetic tunnel junction may be greater than or equal to 100 KΩ. When the resistance value of the storage unit is far greater than a resistance value of the electrode line, a write current may be effectively prevented from passing through the MTJ. This reduces impact of a sneak path.

In a possible design, a manner of writing the data to the magnetic random access memory provided in the first aspect may be: When the data is written to the magnetic random access memory, the electrode line is configured to provide the write current for a plurality of storage units connected to the electrode line, and each of the plurality of voltage control lines is configured to provide a bias voltage for the plurality of storage units connected to the electrode line.

In a possible design, a manner of reading the data from the magnetic random access memory provided in the first aspect may be: When data is read from the magnetic random access memory, the electrode line is configured to provide a ground circuit for the plurality of storage units connected to the electrode line, and each of the plurality of voltage control lines is configured to provide a read voltage or a read current for the plurality of storage units connected to the electrode line.

In the magnetic random access memory provided in the first aspect, a process of applying the voltage or the current to the electrode line may be implemented in different manners.

Manner 1.

In a possible design, the magnetic random access memory provided in the first aspect further includes a first bit line and a second bit line. The first bit line, the second bit line, and the plurality of voltage control lines are parallel to each other. In addition, each structural unit further includes a word line, a first transistor, and a second transistor. Gate electrodes of the first transistor and the second transistor are separately connected to a word line. A source of the first transistor is connected to the first bit line, a drain of the second transistor is connected to the second bit line, the drain of the first transistor is connected to a first end of an electrode line by using a metal conducting wire, and a source of the second transistor is connected to a second end of the electrode line by using a metal conducting wire.

According to the foregoing solution, a gate bias voltage may be applied to the word line, so that the first transistor and the second transistor are conducted, and different voltages may be applied to the first bit line and the second bit line, to apply the voltage to the electrode line or supply the current to the electrode line.

In the manner 1, when data is written into the magnetic random access memory, the gate bias voltage is separately applied to the first transistor and the second transistor through the word line. A write voltage is applied to the first bit line and the second bit line is grounded. A first bias voltage is applied to a voltage control line in the plurality of voltage control lines that is connected to a storage unit into which the data is to be written, and a second bias voltage is applied to a voltage control line in the plurality of voltage control lines that is connected to a storage unit into which the data is not to be written. The first bias voltage is unequal to the second bias voltage.

The first bias voltage is different from the second bias voltage. In an example, a difference between the first bias voltage and a voltage of the electrode line is a negative value, and a difference between the second bias voltage and the voltage of the electrode line is a positive value or zero. In another example, the difference between the first bias voltage and the voltage of the electrode line is a positive value, and the difference between the second bias voltage and the voltage of the electrode line is a negative value or zero.

According to the foregoing solution, the gate bias voltage may be applied to the word line, so that the first transistor and the second transistor are conducted, and different voltages may be applied to the first bit line and the second bit line, to apply the voltage to the electrode line or supply the current to the electrode line. In addition, different voltages may be applied to the voltage control line connected to the storage unit into which the data is to be written and the voltage control line connected to the storage unit into which the data is not to be written, to write the data.

In an embodiment, when data is read from the magnetic random access memory, the gate bias voltage is separately applied to the first transistor and the second transistor through the word line, so that the first transistor and the second transistor are conducted. Each of the plurality of voltage control lines is configured to apply a read voltage or a read current to a correspondingly connected storage unit, and receive feedback information of the correspondingly connected storage unit. The feedback information indicates data stored in the correspondingly connected storage unit.

When the read voltage is applied to the correspondingly connected storage unit through each voltage control line, the feedback information of the storage unit may be information such as a current and a capacitance of the storage unit. When read voltages applied through the voltage control lines are the same and the storage units are in different resistance states, currents or capacitances fed back by the storage units are different. When the read current is applied to the correspondingly connected storage unit through each voltage control line, the feedback information of the storage unit may be information such as the voltage and the capacitance of the storage unit. When read currents applied through the voltage control lines are the same and the storage units are in different resistance states, voltages or capacitances fed back are different.

In addition, the magnetic random access memory may further include a plurality of amplifiers that are respectively connected to the plurality of voltage control lines in a one-to-one correspondence. Each amplifier in the plurality of amplifiers is configured to read the feedback information received by the correspondingly connected voltage control line.

Each amplifier, a peripheral resistor of the amplifier, and the like form a read loop. The read loop is configured to feed back information of a storage unit corresponding to a voltage control line connected to the amplifier, to read the data from the storage unit. In an embodiment, each amplifier may compare the feedback information (for example, the voltage, the current, the capacitance, and charge/discharge time) of the storage unit with a reference value, to determine whether the storage unit is in a high resistance state or a low resistance state, and then determine data stored in the storage unit.

Manner 2.

In another possible design, each structural unit may further include a first bit line and a second bit line. The first bit line, the second bit line, and the electrode line are parallel to each other. The first bit line is perpendicular to the plurality of voltage control lines, and the second bit line is perpendicular to the plurality of voltage control lines. The first bit line is connected to a first end of the electrode line by using a metal conducting wire, and the second bit line is connected to a second end of the electrode line by using a metal conducting wire.

According to the foregoing solution, the voltage may be applied to the electrode line or the current may be supplied to the electrode line by directly applying different voltages to the first bit line and the second bit line.

In the manner 2, when data is written into the magnetic random access memory, a write voltage is applied to the first bit line and the second bit line is grounded, or the first bit line is grounded and the write voltage is applied to the second bit line. A first bias voltage is applied to a voltage control line in the plurality of voltage control lines that is connected to a storage unit into which the data is to be written, and a second bias voltage is applied to a voltage control line in the plurality of voltage control lines that is connected to a storage unit into which the data is not to be written. The first bias voltage is unequal to the second bias voltage.

The first bias voltage is different from the second bias voltage. In an example, a difference between the first bias voltage and a voltage of the electrode line is a negative value, and a difference between the second bias voltage and the voltage of the electrode line is a positive value or zero. In another example, the difference between the first bias voltage and the voltage of the electrode line is a positive value, and the difference between the second bias voltage and the voltage of the electrode line is a negative value or zero.

According to the foregoing solution, the voltage may be applied to the electrode line or the current may be supplied to the electrode line by applying different voltages to the first bit line and the second bit line. In addition, different voltages may be applied to the voltage control line connected to the storage unit into which the data is to be written and the voltage control line connected to the storage unit into which the data is not to be written, to write the data.

In an embodiment, when the data is read from the magnetic random access memory, each of the plurality of voltage control lines is configured to apply a read voltage or a read current to a correspondingly connected storage unit, and receive feedback information of the correspondingly connected storage unit. The feedback information indicates data stored in the correspondingly connected storage unit.

When the read voltage is applied to the correspondingly connected storage unit through each voltage control line, the feedback information of the storage unit may be information such as a current and a capacitance of the storage unit. When read voltages applied through the voltage control lines are the same and the storage units are in different resistance states, currents or capacitances fed back by the storage units are different. When the read current is applied to the correspondingly connected storage unit through each voltage control line, the feedback information of the storage unit may be information such as the voltage and the capacitance of the storage unit. When read currents applied through the voltage control lines are the same and the storage units are in different resistance states, voltages or capacitances fed back are different.

In addition, the magnetic random access memory may further include a plurality of amplifiers that are respectively connected to the plurality of voltage control lines in a one-to-one correspondence. Each amplifier in the plurality of amplifiers is configured to read feedback information received by the correspondingly connected voltage control line.

Each amplifier, a peripheral resistor of the amplifier, and the like form a read loop. The read loop is configured to feed back information of a storage unit corresponding to a voltage control line connected to the amplifier, to read the data from the storage unit. In an embodiment, each amplifier may compare the feedback information (for example, the voltage, the current, the capacitance, and charge/discharge time) of the storage unit with a reference value, to determine whether the storage unit is in a high resistance state or a low resistance state, and then determine data stored in the storage unit.

In a possible design, in the magnetic random access memory provided in the first aspect, each magnetic tunnel junction includes a free layer, a potential barrier layer, and a reference layer that are stacked in sequence, the free layer is connected to the electrode line, and the reference layer is connected to the voltage control line.

According to a second aspect, an embodiment of this application provides an electronic device. The electronic device includes a processor and the magnetic random access memory that is coupled to the processor and provided in the first aspect and any one of the possible designs of the first aspect.

In an embodiment, the processor may invoke a software program stored in the magnetic random access memory, to perform a corresponding method and implement a corresponding function of the electronic device.

DESCRIPTION OF EMBODIMENTS

Embodiments of this application provide a magnetic random access memory and an electronic device, to improve a storage density of the magnetic random access memory and stability of storage units.

The following briefly describes application scenarios of embodiments of this application.

Figure 2:
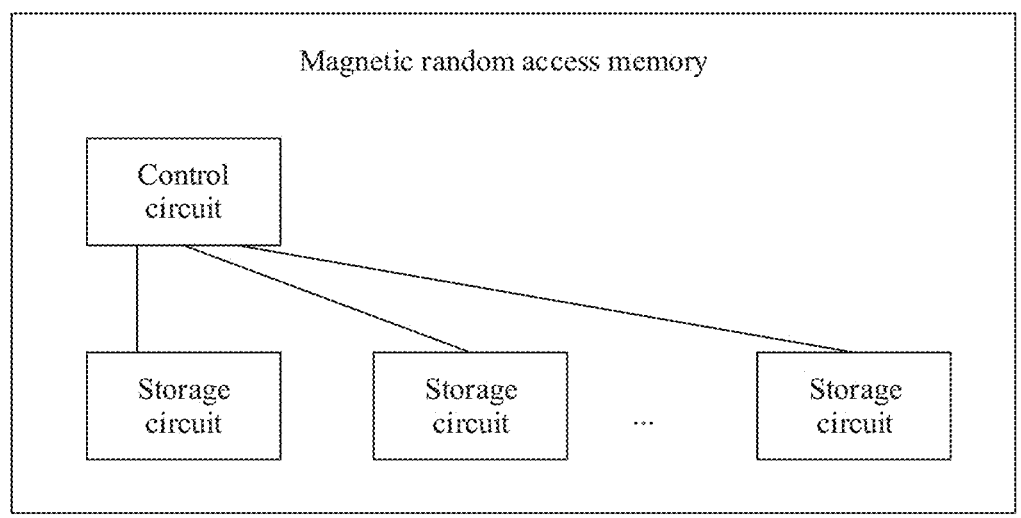
FIG. 2 is a schematic diagram of a structure of a first magnetic random access memory according to an embodiment of this application.

This embodiment of this application may be applied to a magnetic random access memory shown in FIG. 2. The magnetic random access memory includes a control circuit and at least one storage circuit.

In an embodiment, each storage circuit is configured to write and read data. The control circuit is configured to control a process of writing and reading the data by using the storage circuit. For example, when data is written, a storage unit into which the data is to be written is selected, and then the data is written into the selected storage unit by applying a corresponding voltage and supplying a corresponding current. For another example, when data is read, a storage unit from which the data is to be read is selected, and then the data is read from the selected storage unit by applying a corresponding voltage and supplying a corresponding current.

Each storage circuit includes a plurality of storage units. The storage unit is a smallest unit that has data storage and read/write functions in the magnetic random access memory, and may be configured to store the smallest unit of information, that is, 1-bit data (for example, 0 or 1), a binary bit.

The following further describes in detail embodiments of this application with reference to the accompanying drawings.

It should be noted that "a plurality of" used in this application means two or more. In addition, it should be understood that, in descriptions of this application, terms such as "first" and "second" are merely used for distinguishing and description, but should not be understood as an indication or implication of relative importance, or an indication or implication of a sequence.

Figure 3:
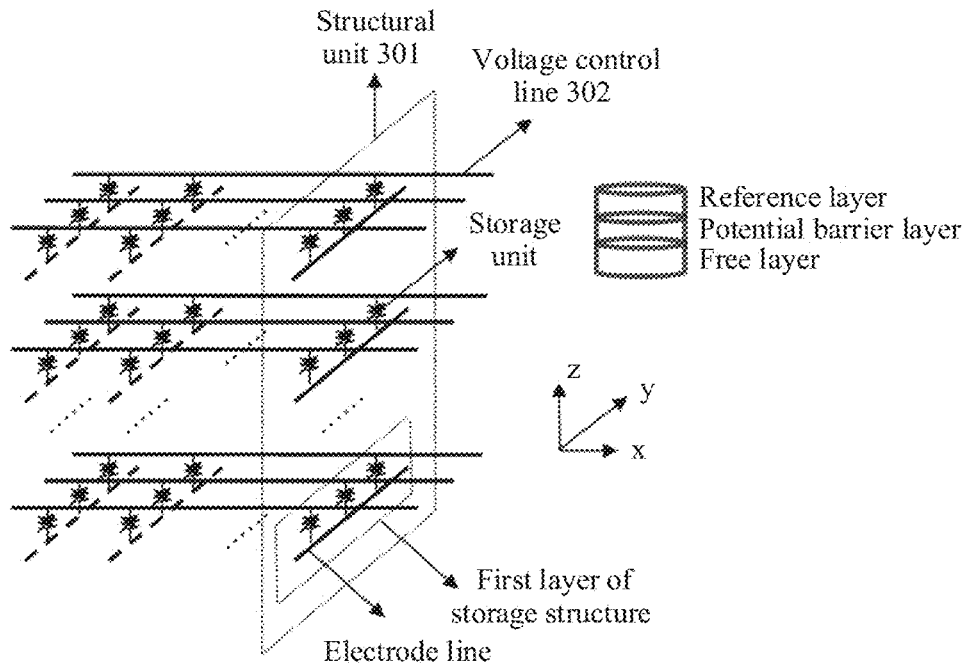
FIG. 3 is a schematic diagram of a structure of a second magnetic random access memory according to an embodiment of this application.

Refer to FIG. 3. FIG. 3 is a schematic diagram of a structure of a magnetic random access memory according to an embodiment of this application. The magnetic random access memory includes a plurality of structural units 301 and a plurality of voltage control lines 302. The plurality of structural units 301 and the plurality of voltage control lines 302 may be considered as the storage circuits in FIG. 2.

Each structural unit 301 includes a multi-layer storage structure that is stacked in sequence. Each layer of the multi-layer storage structure includes an electrode line and a plurality of storage units disposed on the electrode line. Each of the plurality of storage units includes one magnetic tunnel junction. One end of each storage unit is connected to the electrode line (MTJ), and the other end is connected to one of the plurality of voltage control lines.

Optionally, the plurality of voltage control lines 302 are parallel; planes in which the plurality of structural units 301 are located are parallel, and a plane in which each structural unit 301 is located is perpendicular to the plurality of voltage control lines 302.

It should be noted that, in this embodiment of this application, a concept that the plurality of voltage control lines 302 are parallel is not strictly parallel. In a process of preparing the magnetic random access memory, due to impact of a preparation process and a preparation device, the plurality of voltage control lines 302 may not be strictly parallel. This is caused by a specific preparation process, and does not indicate that the plurality of voltage control lines 302 being not strictly parallel is beyond the protection scope of this application. In addition, planes are parallel and planes are perpendicular may be understood in a same way. Details are not described herein again.

It should be noted that FIG. 3 is merely an example in which three storage units are disposed on each electrode line. In an actual application, a quantity of storage units disposed on each electrode line is not limited. Because the voltage control lines 302 one-to-one correspond to the storage units, in each layer of the storage structure in the example in FIG. 3, there are also three voltage control lines 302 connected to the storage units. In an actual application, a quantity of voltage control lines 302 connected to the storage units varies with the quantity of storage units.

For ease of description, the magnetic random access memory shown in FIG. 3 shows a xyz coordinate system. The voltage control lines 302 are parallelly arranged along the x-axis, the electrode lines are parallelly arranged along the y-axis, and the multi-layer storage structure is stacked in sequence along the z-axis. A plane in which each structural unit 301 is located is perpendicular to the x-axis.

In addition, the example in FIG. 3 only shows a solution in which the plurality of structural units 301 are repeatedly arranged along the x-axis. In an actual application, a plurality of structural units may also be repeatedly arranged along the y-axis. Correspondingly, each structural unit is perpendicular to the correspondingly connected plurality of voltage control lines. Because a structure and a read/write principle of the structural units repeatedly arranged along the y-axis are consistent with those of the structural units 301 shown in FIG. 3, the structural units repeatedly arranged along the y-axis are not described in detail in this embodiment of this application.

It should be understood that the storage unit is a smallest unit that has data storage and read/write functions in the magnetic random access memory, and may be configured to store the smallest unit of information, that is, 1-bit data (for example, 0 or 1), a binary bit. A plurality of binary bit data may be stored through the plurality of storage units. In an embodiment, in this embodiment of this application, one storage unit includes one MTJ, configured to store one binary bit data. Each MTJ may include a free layer, a potential barrier layer, and a reference layer that are stacked in sequence in a positive direction of the z-axis. A direction of a magnetic moment of the reference layer is fixed, and a direction of a magnetic moment of the free layer may be changed when data is written. When being parallelly or anti-parallelly arranged, the magnetic moments of the free layer and the reference layer correspond to different data. The potential barrier layer is configured to generate a tunnel magneto resistance effect. In an embodiment, in this application, the free layer is connected to the electrode line, and the reference layer is connected to the voltage control line as shown in FIG. 3. In other words, the free layer is close to an electrode line connected to the MTJ, the reference layer is farthest away from the electrode line, and the potential barrier layer is located between the free layer and the reference layer.

Figure 4:
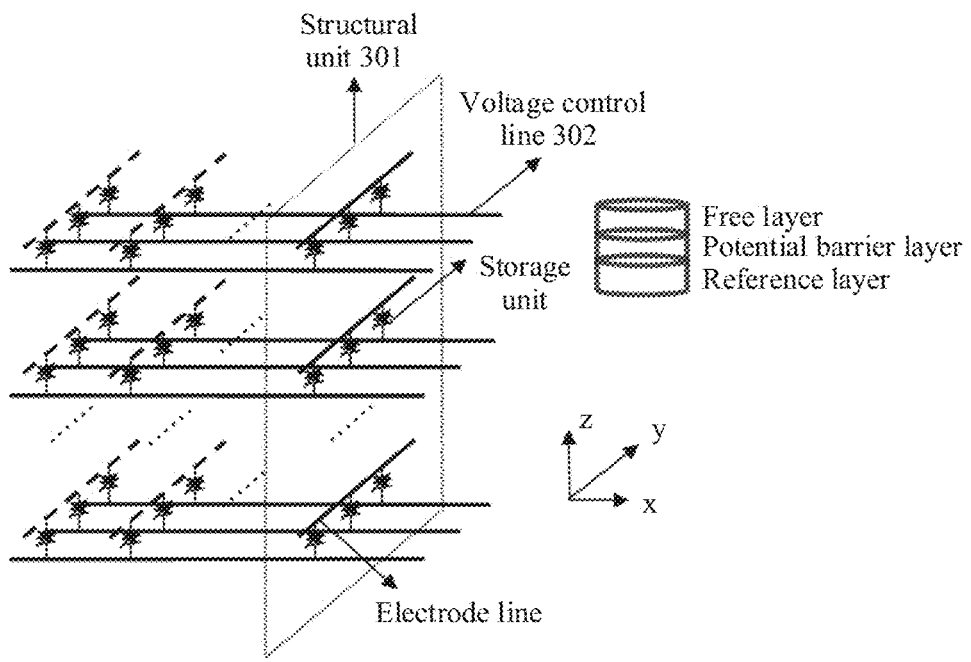
FIG. 4 is a schematic diagram of a structure of a third magnetic random access memory according to an embodiment of this application.

It should be understood that a structure of the magnetic random access memory shown in FIG. 3 is merely an example. In an actual application, whether the MTJ is located on or below the electrode line is not limited. In another example, FIG. 4 shows a structure of the magnetic random access memory provided in this embodiment of this application. In the magnetic random access memory shown in FIG. 4, MTJs are arranged in a reverse direction of the z-axis, and correspondingly positions of the voltage control lines 302 connected to the MTJs also are changed. It should be noted that, in the example in FIG. 4, similarly the free layer in the MTJ is close to the electrode line, the reference layer is farthest away from the electrode line, and the potential barrier layer is located between the free layer and the reference layer.

For ease of description, in following examples, the structure shown in FIG. 3 is used as an example for description. A specific implementation and a read/write principle of the structure shown in FIG. 4 are similar to those in the example in FIG. 3. Details are not described again in this application.

The magnetic random access memory provided in this embodiment of this application uses an SOT effect and a VCMA effect to write data, and uses a tunnel magneto resistance (TMR) effect to read data.

A principle of the SOT effect is: when a current is supplied to an electrode line, a spin-polarized current that diffuses upward (that is, in a positive direction of the z-axis) is generated, and enters a free layer of an MTJ. When the current reaches a value (a critical reverse current density), due to interaction torque of a spin orbit, a magnetic moment of the free layer is reversed to write data. When a direction of the current in the electrode line is changed, a polarization direction of the spin-polarized current is changed, and a reverse direction of the magnetic moment of the free layer is also accordingly changed to write different data. A principle of the VCMA effect is: Interface charge densities of a free layer and a potential barrier layer of an MTJ may be changed by applying a bias voltage to two ends of the MTJ. This changes perpendicular anisotropy and coercivity of the free layer, and then reduces the critical reverse current density of the MTJ. When the critical reverse current density of the MTJ is reduced by using the VCMA effect, the current is supplied to the electrode line, so that the magnetic moment of the free layer is reversed by jointly using the SOT effect and the VCMA effect, to write data. This writing manner can significantly reduce power consumption when the data is written.

In an actual application, the electrode line may be made of a heavy metal material, or made of another material that can generate a spin-polarized current. The electrode line may also be referred to as an SOT electrode line.

Figure 5:
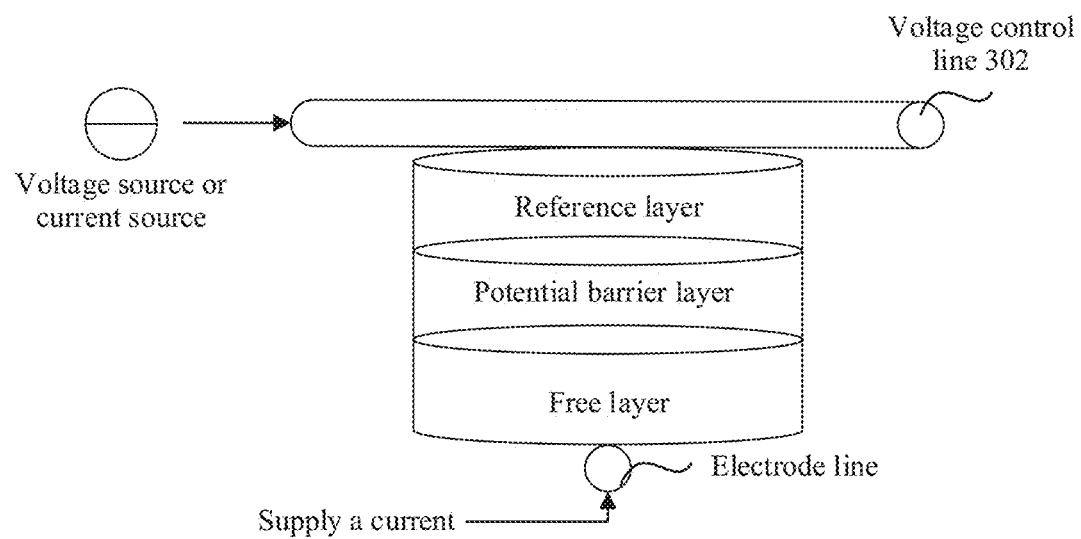
FIG. 5 is a schematic diagram of a structure of an MTJ according to an embodiment of this application.

For example, the structure of the MTJ in the magnetic random access memory shown in FIG. 3 may be that shown in FIG. 5. It can be seen from FIG. 5 that a free layer of an MTJ is connected to an electrode line, and a reference layer of the MTJ is connected to a voltage control line 302. A voltage may be applied or a current may be supplied to the voltage control line 302, and a current is supplied to the electrode line through a voltage source or a current source, so that a difference is generated between the voltage on the voltage control line 302 and the voltage on the electrode line. The voltage difference is a bias voltage applied to the two ends of the MTJ.

In an embodiment, in this embodiment of this application, when data is written into the magnetic random access memory, a selective operation on an MTJ connected to the voltage control line 302 may be independently performed through the voltage control line 302. For example, a first bias voltage may be applied to a voltage control line connected to a to-be-written storage unit, to reduce a critical reverse current density of the to-be-written storage unit. A second bias voltage may be applied to a voltage control line connected to a non-written storage unit, to improve (or unchange) a critical reverse current density of the not-to-be-written storage unit. In addition, a spin-polarized current that diffuses upward (that is, toward a positive direction of the z-axis) is generated by supplying a write current to an electrode line connected to the to-be-written storage unit (different data may be written by supplying currents in different directions), and then enters the free layer of the MTJ, to write data into the to-be-written storage unit.

A principle of a TMR effect is: when magnetic moments of a free layer and a reference layer of an MTJ are parallelly arranged, the MTJ is in a low resistance state; or when the magnetic moments of the free layer and the reference layer are anti-parallelly arranged (that is, parallel and opposite directions), the MTJ is in a high resistance state. The high and low resistance states represent two different data states, for example, 0 and 1. Different data may be read when the MTJ is in the high resistance state or the low resistance state.

In an embodiment, in this embodiment of this application, when data is read from the magnetic random access memory, an electrode line connected to a to-be-read storage unit is configured to provide a ground circuit for the storage unit. After a read voltage is applied or a read current is supplied to a voltage control line 302 connected to the to-be-read storage unit, data information carried in the to-be-read storage unit may be obtained by using a read loop (for example, including an amplifier) connected to the voltage control line 302.

For example, by reading an output voltage of the amplifier in the loop, it may be determined that an MTJ corresponding to the voltage control line 302 connected to the amplifier is in the high resistance state or the low resistance state, and then determined that data stored in the MTJ is 0 or 1.

When data is written, to prevent a current on the electrode line from passing through the MTJ to form a sneak path and affect accuracy of the written data, in this embodiment of this application, the MTJ may be in the high resistance. For example, if a resistance value of the MTJ is not less than 100 KΩ, the resistance value of the MTJ is far greater than a resistance value of the electrode line. This can effectively prevent the write current from passing through the MTJ, and reduce impact of the sneak path.

In addition, in the magnetic random access memory shown in FIG. 3, directions of the magnetic moments of the free layer and the reference layer are parallel or anti-parallel. In an embodiment, the directions of the magnetic moments of the free layer and the reference layer may be within a xy plane, may be perpendicular to the xy plane, or may form a specific tilt angle with the xy plane. The directions of the magnetic moments of the free layer and the reference layer are not limited in this embodiment of this application, provided that the directions of the magnetic moments of the free layer and the reference layer are parallel or anti-parallel.

As described above, data may be written into the magnetic random access memory or data may be read from the magnetic random access memory by applying the voltage or supplying the current to the voltage control line 302 and the electrode line. In an actual application, there may be a plurality of manners of applying the voltage and supplying the current. The following uses two specific embodiments as examples for description.

Embodiment 1

In Embodiment 1, a process of applying a voltage or supplying a current to an electrode line may be implemented by two transistors respectively connected to two bit lines. One bit line is connected to one end of the electrode line through one transistor, and the other bit line is connected to the other end of the electrode line through the other transistor. The two transistors are conducted and cut off through a word line. The two transistors are conducted by separately applying a gate bias voltage to the two transistors through the word line and applying different voltages to the two bit lines, to apply the voltage or supply the current to the electrode line.

In an embodiment, in a possible implementation, the magnetic random access memory shown in FIG. 3 may further include a first bit line and a second bit line. Each structural unit 301 further includes a word line, a first transistor, and a second transistor. Gates of the first transistor and the second transistor are separately connected to the word line, a source of the first transistor is connected to the first bit line, a drain of the second transistor is connected to the second bit line, a drain of the first transistor is connected to a first end of the electrode line by using a metal conducting wire, and a source of the second transistor is connected to a second end of the electrode line by using a metal conducting wire.

A material of the metal conducting wire may be the same as that of the electrode line, or may be different from that of the electrode line. The first transistor and the second transistor may be N metal oxide semiconductor (NMOS) transistors. Certainly, the first transistor and the second transistor may also be another type of transistors, for example, may be P-type metal oxide semiconductor (PMOS) transistors. This is not limited in this embodiment of this application.

It can be easily learned from Embodiment 1, the gates of the first transistor and the second transistor are separately connected to the word line. The word line may be configured to provide the gate bias voltage for the first transistor and the second transistor, so that the first transistor and the second transistor are conducted. Different voltages are separately applied to the first bit line and the second bit line, so that a current passes through the electrode line, that is, a write current may be supplied to a storage unit on the electrode line.

Because the first transistor may be connected to first ends of all electrode lines in one structural unit by using one metal conducting wire, and the second transistor may be connected to second ends of all electrode lines in one structural unit by using another metal conducting wire, the solution in Embodiment 1 may be used to parallelly supply the write current to all the electrode lines in one structural unit.

In an embodiment, in Embodiment 1, when data is written into the magnetic random access memory, a manner of applying a voltage or supplying a current to the first bit line, the second bit line, the word line, and the voltage control line may be: the gate bias voltage is separately applied to the first transistor and the second transistor through the word line, so that the first transistor and the second transistor are conducted; a write voltage is applied to the first bit line and the second bit line is grounded; and a first bias voltage is applied to a voltage control line 302 in the plurality of voltage control lines 302 that is connected to a storage unit into which the data is to be written, a second bias voltage is applied to a voltage control line 302 in the plurality of voltage control lines 302 that is connected to a storage unit into which the data is not to be written, and the first bias voltage is unequal to the second bias voltage.

The first bias voltage is used to reduce a critical reverse current density of the to-be-written storage unit, and the second bias voltage is used to increase (or unchange) a critical reverse current density of the not-to-be-written storage unit. Values of the first bias voltage and the second bias voltage are different, and specific values of the first bias voltage and the second bias voltage may be determined based on a specific structure and material parameters of the storage unit. That is, when the first bias voltage is applied to the voltage control line 302, the data may be written into the storage unit connected to the voltage control line 302. When the second bias voltage is applied to the voltage control line 302, the data cannot be written into the storage unit connected to the voltage control line 302.

In a specific example, a difference between the first bias voltage and a voltage of the electrode line is a negative value, and a difference between the second bias voltage and the voltage of the electrode line is a positive value or zero. Alternatively, the difference between the first bias voltage and the voltage of the electrode line is a positive value, and the difference between the second bias voltage and the voltage of the electrode line is a negative value or zero.

When data is written into a storage unit, a direction of a required current in the electrode line may be determined based on the data (0 or 1) that is to be written, and then the required current passes through the electrode line by applying a corresponding voltage to the first bit line, the second bit line, and the word line. In addition, the first bias voltage is applied to a voltage control line 302 connected to a storage unit into which data is to be written, and the second bias voltage is applied to a voltage control line 302 connected to a storage unit into which data is not to be written, to implement a process of writing the data to the storage unit.

In addition, when data is read from the magnetic random access memory, data stored in all storage units in a structural unit 301 may be read at a time.

The data in the storage unit is read by using the TMR effect. When the data is read from the magnetic random access memory, the gate bias voltage is separately applied to the first transistor and the second transistor through the word line, so that the first transistor and the second transistor are conducted. Each voltage control line 302 in the plurality of voltage control lines 302 is configured to apply a read voltage or a read current to a correspondingly connected storage unit, and receive feedback information of the correspondingly connected storage unit. The feedback information indicates data stored in the correspondingly connected storage unit.

When the read voltage is applied to the correspondingly connected storage unit through each voltage control line, the feedback information of the storage unit may be information such as a current and a capacitance of the storage unit. When read voltages applied through the voltage control lines are the same and the storage units are in different resistance states, currents or capacitances fed back by the storage units are different. When the read current is applied to the correspondingly connected storage unit through each voltage control line, the feedback information of the storage unit may be information such as the voltage and the capacitance of the storage unit. When read currents applied through the voltage control lines are the same and the storage units are in different resistance states, voltages or capacitances fed back are different.

In addition, the magnetic random access memory may further include a plurality of amplifiers that are respectively connected to the plurality of voltage control lines in a one-to-one correspondence. Each amplifier in the plurality of amplifiers is configured to read the feedback information received by the correspondingly connected voltage control line.

Each amplifier, a peripheral resistor of the amplifier, and the like form a read loop. The read loop is configured to feed back information of a storage unit corresponding to a voltage control line connected to the amplifier, to read the data from the storage unit.

In an embodiment, each amplifier may compare the feedback information (for example, the voltage, the current, the capacitance, and charge/discharge time) of the storage unit with a reference value, to determine whether the storage unit is in a high resistance state or a low resistance state, and then determine data stored in the storage unit.

In an actual application, when data is written into the magnetic random access memory, the foregoing process of applying the voltage or supplying the current to the first bit line, the second bit line, the word line, and the voltage control line 302 may be controlled by a level control circuit configured in the magnetic random access memory. The level control circuit is configured to supply a required voltage or a required current to the first bit line, the second bit line, the word line, and the voltage control line 302. Similarly, when data is read from the magnetic random access memory, a process of applying a voltage or supplying a current to the voltage control line 302 may also be controlled by the level control circuit. The level control circuit is configured to supply a required voltage or a required current to the voltage control line 302.

In addition, the magnetic random access memory may further include a row address decoder circuit and a column address decoder circuit, configured to select a corresponding storage unit through the word line and the bit line when data is written or read. The level control circuit is configured to determine, according to selection of the row address decoder circuit and the column address decoder circuit, a voltage or a current that is to be applied or supplied to the first bit line, the second bit line, and the word line, to perform a read/write operation on one or several storage units selected by the row address decoder circuit and the column address decoder circuit.

The level control circuit, the row address decoder circuit, and the column address decoder circuit may be collectively referred to as a control circuit.

Figure 6:
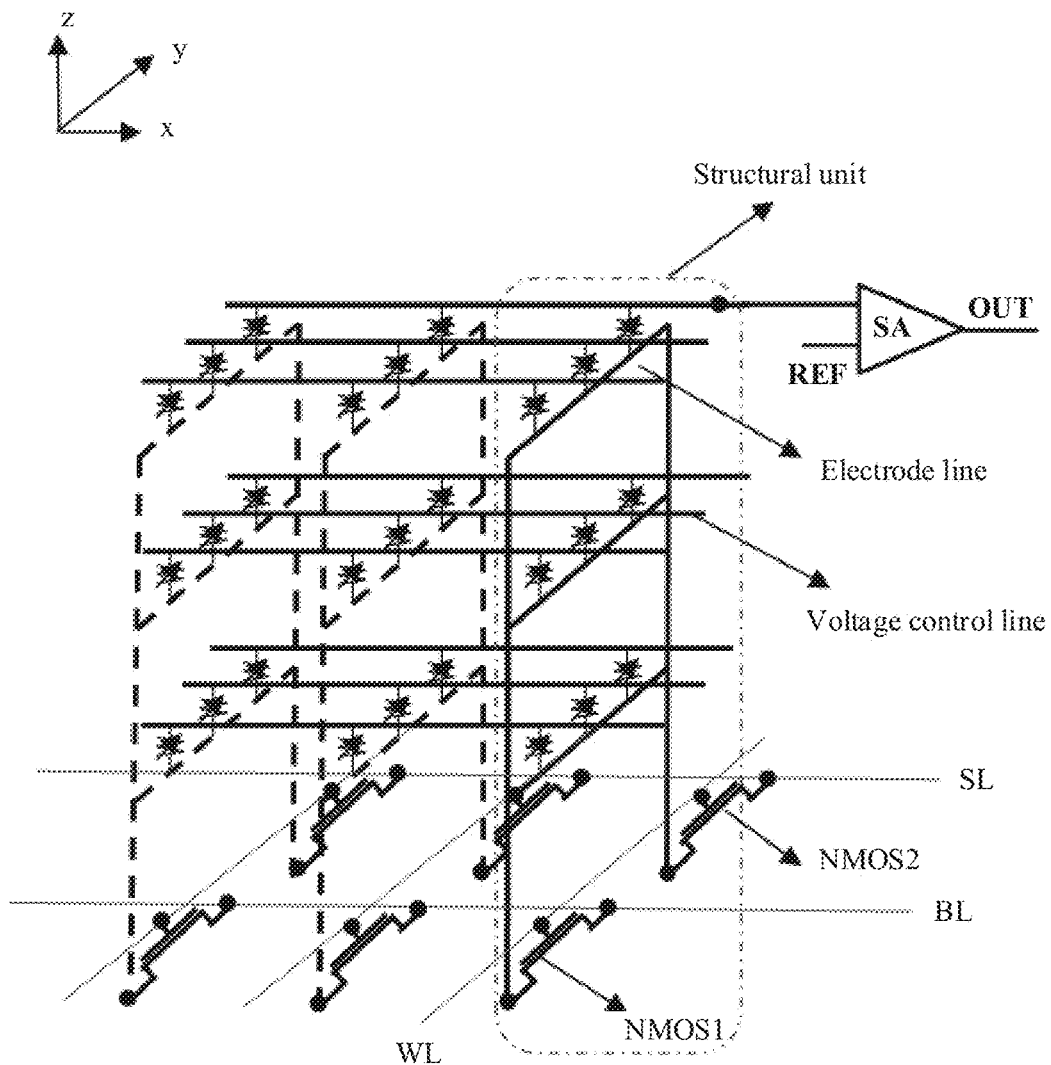
FIG. 6 is a schematic diagram of a structure of a fourth magnetic random access memory according to an embodiment of this application.

For example, FIG. 6 is a schematic diagram of a possible structure of a magnetic random access memory according to Embodiment 1. FIG. 6 uses an example in which the magnetic random access memory includes three structural units (may also be referred to as cells) that are periodically arranged along the x-axis, each structural unit includes a three-layer storage structure, and each layer of the storage structure includes three storage units. In an actual application, a quantity of structural units, a quantity of layers of the storage structure, and a quantity of storage units at each layer of the storage structure are not limited.

In the magnetic random access memory shown in FIG. 6, two NMOSs (that is, an NMOS1 and an NMOS2) in one cell share one WL, and the WL is connected to a gate of the NMOS1 (NMOS2) and configured to conduct or cut off the NMOS1 (NMOS2). One end of the NMOS1 (NMOS2) is connected to a BL (SL), and the other end is connected to an electrode line by using a metal conducting wire. A voltage control line on each MTJ is parallel to the BL (SL) and perpendicular to the WL and the electrode line. Different cells arranged along the x-axis share the BL, the SL, and the voltage control line, and each cell includes one WL. Each voltage control line is connected to a sense amplifier (SA), and configured to read data stored in the MTJ. FIG. 6 shows only one SA. Actually, the magnetic random access memory shown in FIG. 6 may include nine SAs, and the nine SAs are respectively connected to nine voltage control lines. The BL (SL) is selected by using a row address decoder circuit, and the WL is selected by using a column address decoder circuit. Alternatively, the BL (SL) is selected by using the column address decoder circuit, and the WL is selected by using the row address decoder circuit.

As described above, when currents in different directions are supplied to the electrode lines, different data (for example, 0 or 1) may be written into the storage units on the electrode lines. Then, in the example of FIG. 6, if a y-axis current is supplied to the electrode line, the BL may be considered as a first bit line, the NMOS1 may be considered as a first transistor, the SL may be considered as a second bit line, and the NMOS2 may be considered as a second transistor. A voltage applied to the BL is greater than that applied to the SL, and a current in a path of BL→NMOS1→metal conducting wire (parallel to the z-axis)→electrode wire→metal conducting wire (parallel to the z-axis)→NMOS2→SL is generated, that is, the y-axis current is supplied to the electrode line (for example, data 0 or 1 may be written at this moment). If a −y-axis current is supplied to the electrode line, the SL may be considered as the first bit line, the NMOS2 may be considered as the first transistor, the BL may be considered as the second bit line, and the NMOS1 may be considered as the second transistor. A voltage applied to the SL is greater than that applied to the BL, and a current in a path of SL→NMOS2→metal conducting wire (parallel to the z-axis)→electrode wire→metal conducting wire (parallel to the z-axis)→NMOS1→BL is generated, that is, the −y-axis current is supplied to the electrode line (for example, data 1 or 0 may be written at this moment).

Figure 7:
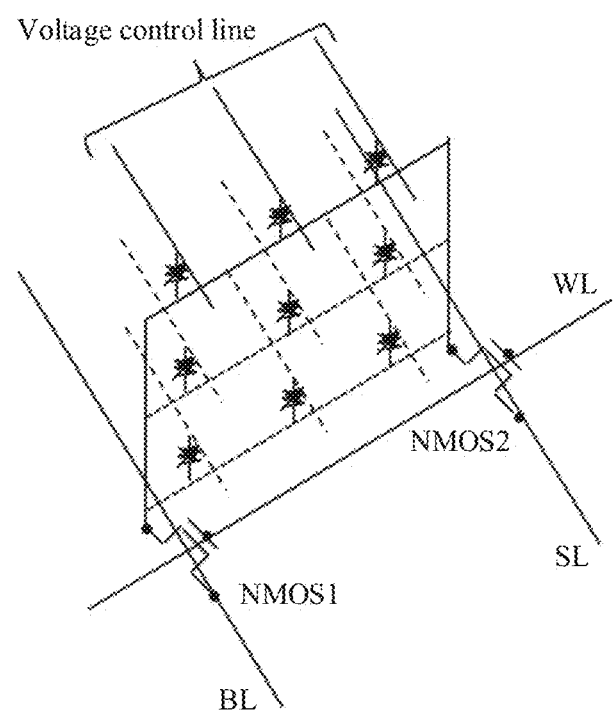
FIG. 7 is a schematic view of reading and writing data from and to a magnetic random access memory according to an embodiment of this application.

FIG. 7 shows a schematic view of reading and writing data from and to a cell in the magnetic random access memory in FIG. 6.

When data is to be written into one MTJ, the WL of a cell in which the MTJ is located may be first found through the row address decoder circuit (or the column address decoder circuit). A level control circuit applies a gate bias voltage to the WL according to selection of the row address decoder circuit (or the column address decoder circuit), and two NMOSs (the NMOS1 and the NMOS2) in the cell are conducted. The level control circuit applies a write voltage (different data may be written by applying positive and negative voltages) between the BL and the SL according to selection of the column address decoder circuit (or the row address decoder circuit), applies a first bias voltage to a voltage control line above a to-be-written MTJ, and applies a second bias voltage on a voltage control line to a not-to-be-written MTJ. A magnetic moment of a free layer of the to-be-written MTJ is reversed by jointly using the SOT effect and the VCMA effect, and a direction of a magnetic moment of the not-to-be-written MTJ is unchanged, to write data into the to-be-written MTJ.

When data is to be read from the magnetic random access memory, data stored in all MTJs in the cell may be read at a time. The level control circuit applies a gate bias voltage to the WL in the cell according to selection of the row address decoder circuit (or the column address decoder circuit), and the NMOS1 and the NMOS2 are conducted. In addition, a read voltage or a current is applied or supplied to each voltage control line 302, so that each MTJ in the cell is included in an independent read loop. The SA in each read loop reads, by identifying a resistance value of the MTJ, the data stored in the MTJ.

Embodiment 2

In Embodiment 2, a process of applying a voltage or a current to an electrode line may be implemented by using two bit lines. One bit line is connected to one end of an electrode line, and the other bit line is connected to the other end of the electrode line. The voltage may be applied or the current may be supplied to the electrode line by applying different voltages to the two bit lines. Different from Embodiment 1, in Embodiment 2, the voltage is applied or the current is supplied to the electrode line without conducting a transistor through a word line, but the voltage is directly applied or the current is directly supplied to the electrode line by applying different voltages to the two bit lines.

In an embodiment, in a possible implementation, in the magnetic random access memory shown in FIG. 3, the structural unit 301 may further include a first bit line and a second bit line. The first bit line, the second bit line, and the electrode line are parallel to each other. The first bit line is perpendicular to the plurality of voltage control lines 302, and the second bit line is perpendicular to the plurality of voltage control lines 302. The first bit line is connected to a first end of the electrode line by using a metal conducting wire, and the second bit line is connected to a second end of the electrode line by using a metal conducting wire.

A material of the metal conducting wire may be the same as that of the electrode line, or may be different from that of the electrode line.

It can be learned that, in Embodiment 2, the first bit line is connected to the first end of the electrode line by using the metal conducting wire, and the second bit line is connected to the second end of the electrode line by using the metal conducting wire. Therefore, different voltages are separately applied to the first bit line and the second bit line, so that a current passes through the electrode line, that is, a write current may be supplied to the storage unit on the electrode line. When the voltage difference between the first bit line and the second bit line is positive or negative, currents in different directions may be supplied to the electrode line, to write different data into the storage unit.

Because the first bit line may be connected to first ends of all electrode lines in one structural unit by using one metal conducting wire, and the second bit line may be connected to second ends of all electrode lines in one structural unit by using another metal conducting wire, the solution in Embodiment 2 may be used to parallelly supply the write current to all the electrode lines in one structural unit 301.

For example, in Embodiment 2, when data is written into the magnetic random access memory, a manner of applying a voltage or supplying a current to the first bit line, the second bit line, and the voltage control line may be: a write voltage is applied to the first bit line, and the second bit line is grounded; or the first bit line is grounded, and a write voltage is applied to the second bit line. A first bias voltage is applied to a voltage control line 302 in the plurality of voltage control lines 302 that is connected to a storage unit into which data is to be written, and a second bias voltage is applied to a voltage control line 302 in the plurality of voltage control lines 302 that is connected to a storage unit into which data is not to be written. The first bias voltage is unequal to the second bias voltage.

The first bias voltage is used to reduce a critical reverse current density of a to-be-written storage unit, and the second bias voltage is used to improve (or unchange) a critical reverse current density of a not-to-be-written storage unit. Values of the first bias voltage and the second bias voltage are different, and specific values of the first bias voltage and the second bias voltage may be determined based on a specific structure and material parameters of the storage unit. That is, when the first bias voltage is applied to the voltage control line 302, the data may be written into the storage unit connected to the voltage control line 302. When the second bias voltage is applied to the voltage control line 302, the data cannot be written into the storage unit connected to the voltage control line 302.

In a specific example, a difference between the first bias voltage and a voltage of the electrode line is a negative value, and a difference between the second bias voltage and the voltage of the electrode line is a positive value or zero. Alternatively, the difference between the first bias voltage and the voltage of the electrode line is a positive value, and the difference between the second bias voltage and the voltage of the electrode line is a negative value or zero.

When data is written into a storage unit, a direction of a required current in the electrode line may be determined based on the data (0 or 1) that is to be written, to determine to apply the write voltage to the first bit line or the second bit line. In addition, a first bias voltage is applied to a voltage control line 302 connected to a storage unit into which data is to be written, and the second bias voltage is applied to a voltage control line 302 connected to a storage unit into which data is not to be written, to implement a process of writing the data to the storage unit.

In addition, when data is read from the magnetic random access memory, data stored in all storage units in a structural unit 301 may be read at a time.

The data in the storage unit is read by using the TMR effect. When the data is read from the magnetic random access memory, each voltage control line 302 in the plurality of voltage control lines 302 is configured to apply a read voltage or a read current to a correspondingly connected storage unit, and receive feedback information of the correspondingly connected storage unit; and the feedback information indicates data stored in the correspondingly connected storage unit. The first bit line and the second bit line may be grounded to provide a ground circuit.

When the read voltage is applied to the correspondingly connected storage unit through each voltage control line, the feedback information of the storage unit may be information such as a current and a capacitance of the storage unit. When read voltages applied through the voltage control lines are the same and the storage units are in different resistance states, currents or capacitances fed back by the storage units are different. When the read current is applied to the correspondingly connected storage unit through each voltage control line, the feedback information of the storage unit may be information such as the voltage and the capacitance of the storage unit. When read currents applied through the voltage control lines are the same and the storage units are in different resistance states, voltages or capacitances fed back are different.

In addition, the magnetic random access memory may further include a plurality of amplifiers that are respectively connected to the plurality of voltage control lines in a one-to-one correspondence. Each amplifier in the plurality of amplifiers is configured to read the feedback information received by the correspondingly connected voltage control line.

Each amplifier, a peripheral resistor of the amplifier, and the like form a read loop. The read loop is configured to feed back information of a storage unit corresponding to a voltage control line connected to the amplifier, to read the data from the storage unit.

In an embodiment, each amplifier may compare the feedback information (for example, the voltage, the current, the capacitance, and charge/discharge time) of the storage unit with a reference value, to determine whether the storage unit is in a high resistance state or a low resistance state, and then determine data stored in the storage unit.

In an actual application, when data is written into the magnetic random access memory, the foregoing process of applying the voltage or supplying the current to the first bit line, the second bit line, and the voltage control line 302 may be controlled by a level control circuit configured in the magnetic random access memory. The level control circuit is configured to supply a required voltage or a required current to the first bit line, the second bit line, and the voltage control line 302. Similarly, when data is read from the magnetic random access memory, a process of applying a voltage or supplying a current to the voltage control line 302 may also be controlled by the level control circuit. The level control circuit is configured to supply a required voltage or a required current to the voltage control line 302.

In addition, in Embodiment 2, the voltage control line 302 may also be used as the word line in the magnetic random access memory. The magnetic random access memory may further include a row address decoder circuit and a column address decoder circuit, configured to select a corresponding storage unit through the word line and the bit line when data is written or read. The level control circuit is configured to determine, according to selection of the row address decoder circuit and the column address decoder circuit, a voltage or a current that is to be applied or supplied to the first bit line, the second bit line, and the voltage control line 302, to perform a read/write operation on one or several storage units selected by the row address decoder circuit and the column address decoder circuit.

The level control circuit, the row address decoder circuit, and the column address decoder circuit may be collectively referred to as a control circuit.

Figure 8:
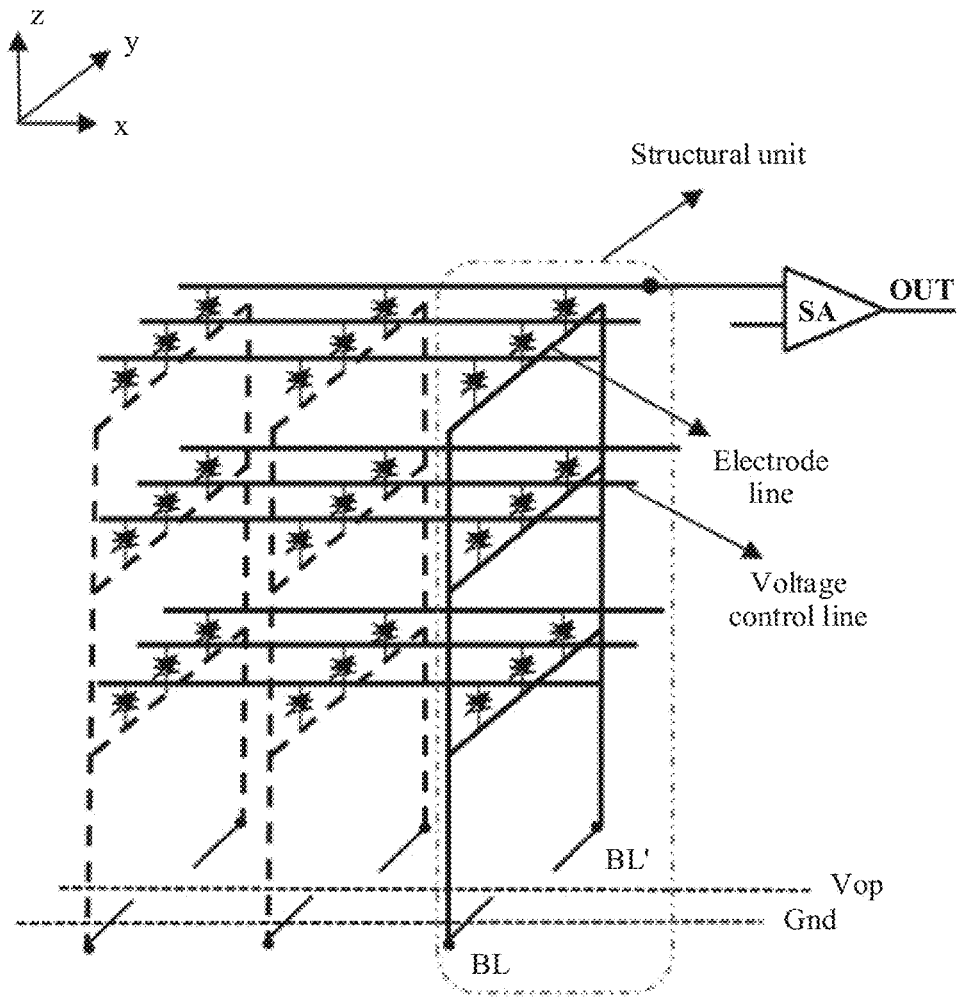
FIG. 8 is a schematic diagram of a structure of a fifth magnetic random access memory according to an embodiment of this application.

For example, FIG. 8 is a schematic diagram of a possible structure of a magnetic random access memory according to Embodiment 2. FIG. 8 uses an example in which the magnetic random access memory includes three structural units (may also be referred to as cells), each structural unit includes a three-layer storage structure, and each layer of the storage structure includes three storage units. In an actual application, a quantity of structural units, a quantity of layers of the storage structure, and a quantity of storage units at each layer of the storage structure are not limited.

In the magnetic random access memory shown in FIG. 8, two ends of each cell are connected to a BL and a BL', and a switching operation may be performed between a write voltage and ground, to parallelly supply write currents in different directions to all electrode lines in the cell. Each voltage control line 302 is connected to an SA, and configured to read data stored in an MTJ. FIG. 8 shows only one SA. Actually, the magnetic random access memory shown in FIG. 8 may include nine SAs, and the nine SAs are respectively connected to the nine voltage control lines 302. The BL (BL') is selected by using a row address decoder circuit, and the voltage control line is selected by using a column address decoder circuit; or the BL (BL') is selected by using the column address decoder circuit, and the voltage control line is selected by using the row address decoder circuit.

The BL may be considered as the first bit line in Embodiment 2, and the BL' may be considered as the second bit line in Embodiment 2.

Figure 9:
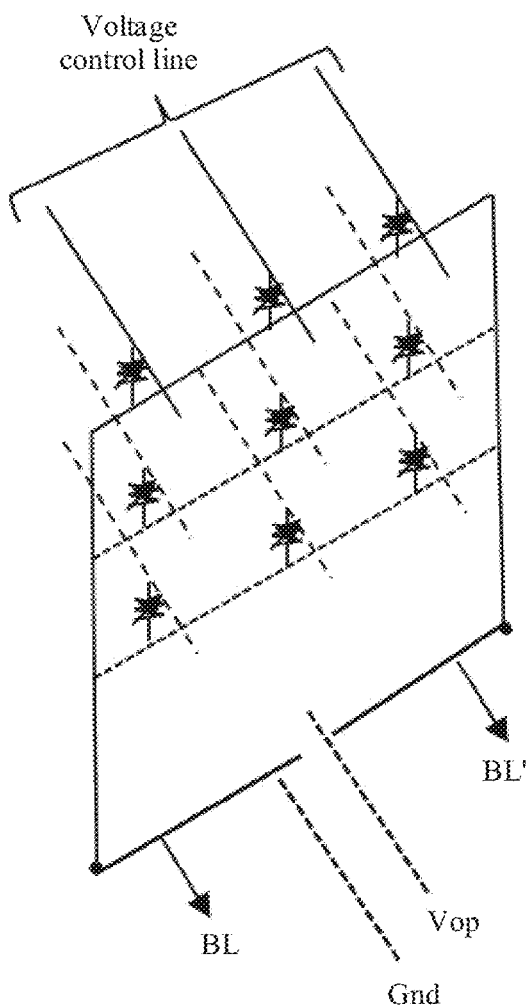
FIG. 9 is a schematic view of reading and writing data from and to another magnetic random access memory according to an embodiment of this application.

FIG. 9 is a schematic view of reading and writing data from and to single cell in the magnetic random access memory shown in FIG. 8.

When data is to be written into one MTJ, the BL and the BL' of a cell in which the MTJ is located may be first found through the row address decoder circuit (or the column address decoder circuit). The BL and the BL' are respectively connected to Vop and Gnd through a level control circuit according to selection of the row address decoder circuit (or the column address decoder circuit). In this way, a write current is generated in all electrode lines in the cell.

In addition, the level control circuit applies a first bias voltage to a voltage control line 302 above a to-be-written MTJ according to selection of the column address decoder circuit (or the row address decoder circuit), instead of applying a second bias voltage to a voltage control line above a not-to-be-written MTJ. A magnetic moment of a free layer of the to-be-written MTJ is reversed by jointly using the SOT effect and the VCMA effect, and a direction of a magnetic moment of the not-to-be-written MTJ is unchanged, to write data into the to-be-written MTJ.

When data is to be read from the magnetic random access memory, data stored in all MTJs in the cell may be read at a time. The level control circuit applies a read voltage or supplies a read current to each voltage control line 302 according to selection of the column address decoder circuit (or a row address decoder circuit), and connects the BL and the BL' read from the cell to Gnd (providing a ground circuit), so that each MTJ in the cell is included in an independent read loop, the SA in each read loop reads data stored in the MTJ by identifying a resistance value of the MTJ.

Figure 1:
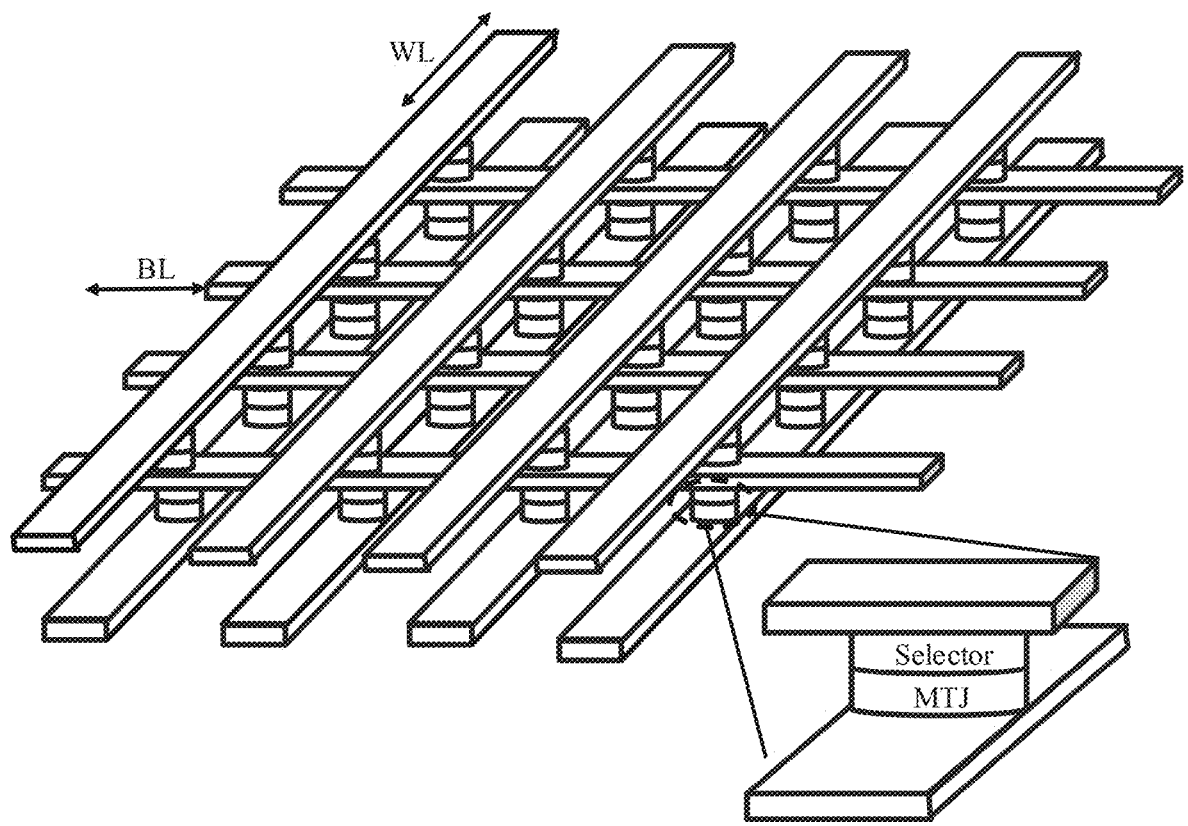
FIG. 1 is a schematic diagram of a structure of a 3D stacked storage array of a magnetic random access memory according to a conventional technology.

According to the magnetic random access memory provided in embodiments of this application, each structural unit includes the multi-layer storage structure, to 3D stack the storage structure, and improve a storage density of the magnetic random access memory. Compared with the 3D stacked storage array shown in FIG. 1, a selector does not need to be used in the storage unit. Therefore, a structure of the storage unit is simpler. In addition, according to the magnetic random access memory provided in embodiments of this application, data may be written to the storage unit by using the SOT effect and the VCMA effect. To be specific, a bias voltage is applied to a voltage control line connected to the magnetic tunnel junction and the VCMA effect is used to change a critical reverse current density of the magnetic tunnel junction, and a current is supplied to an electrode line connected to the magnetic tunnel junction and the SOT effect is used to reverse the magnetic moment of the free layer, to write the data. Compared with a solution shown in FIG. 1, when data is written, no current passes through a junction region (that is, a potential barrier layer) of the magnetic tunnel junction. Therefore, stability of the magnetic tunnel junction is higher. In addition, according to the magnetic random access memory provided in embodiments of this application, each storage unit only includes a magnetic tunnel junction. Therefore, a difficulty in preparing the storage unit can be greatly reduced, and the storage density of the magnetic random access memory can be improved.

Figure 10:
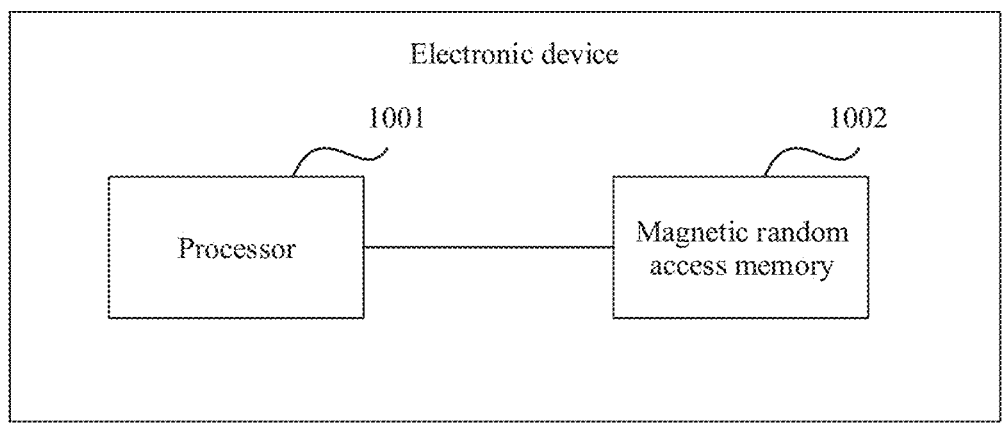
FIG. 10 is a schematic diagram of a structure of an electronic device according to an embodiment of this application.

Based on a same inventive idea, embodiments of this application further provide an electronic device. Refer to FIG. 10. The electronic device includes a processor 1001 and a magnetic random access memory 1002 coupled to the processor 1001. The magnetic random access memory 1002 may be the magnetic random access memory shown in FIG. 3.

In an embodiment, the processor 1001 may invoke a software program stored in the magnetic random access memory 1002, to perform a corresponding method and implement a corresponding function of the electronic device.

Apparently, a person skilled in the art may make various modifications and variations to the embodiments of this application without departing from the scope of the embodiments of this application. In this way, this application is intended to cover these modifications and variations of embodiments of this application provided that they fall within the scope of protection defined by the following claims and their equivalent technologies.

What is claimed is:

1. A magnetic random access memory, comprising:
a plurality of structural units, wherein each structural unit of the plurality of structural units comprises a multi-layer storage structure comprising a plurality of layers that are stacked in sequence, wherein each of the plurality of layers of the multi-layer storage structure comprises an electrode line and a plurality of storage units disposed on the electrode line, and wherein each of the plurality of storage units comprises a magnetic tunnel junction;
a first bit line and a second bit line, wherein the first bit line is connected to a first end of a corresponding electrode line, and the second bit line is connected to a second end of the corresponding electrode line; and
a plurality of voltage control lines,
wherein a first end of each of the plurality of storage units is connected to a corresponding electrode line, and a second end of each of the plurality of storage units is connected to one of the plurality of voltage control lines.

2. The magnetic random access memory of claim 1, wherein the plurality of voltage control lines are in parallel with each other, wherein planes in which the plurality of structural units are located are in parallel with each other, and wherein a plane in which each of the plurality of structural units is located is perpendicular to the plurality of voltage control lines.

3. The magnetic random access memory of claim 1, wherein:
the first bit line, the second bit line, and the plurality of voltage control lines are in parallel with each other; and
each structural unit further comprises a word line, a first transistor, and a second transistor,
wherein gates of the first transistor and the second transistor in each structural unit are separately connected to a corresponding word line, a source of the first transistor is connected to the first bit line, a drain of the second transistor is connected to the second bit line, a drain of the first transistor is connected to a first end of a corresponding electrode line by using a first metal conducting wire, and a source of the second transistor is connected to a second end of the corresponding electrode line by using a second metal conducting wire.

4. The magnetic random access memory of claim 3, wherein:
when data is written into the magnetic random access memory,
a gate bias voltage is separately applied to the first transistor and the second transistor in each structural unit through the corresponding word line;
a write voltage is applied to the first bit line, and the second bit line is grounded; and
a first bias voltage is applied to a voltage control line in the plurality of voltage control lines that is connected to a storage unit into which the data is to be written, a second bias voltage is applied to a voltage control line in the plurality of voltage control lines that is connected to a storage unit into which the data is not to be written, and the first bias voltage is unequal to the second bias voltage.

5. The magnetic random access memory of claim 3, wherein:
when data is read from the magnetic random access memory, a gate bias voltage is separately applied to the first transistor and the second transistor in each structural unit through the corresponding word line;
each of the plurality of voltage control lines is configured to apply a read voltage or a read current to a correspondingly connected storage unit, and receive feedback information of the correspondingly connected storage unit, wherein the feedback information indicates data stored in the correspondingly connected storage unit.

6. The magnetic random access memory of claim 5, further comprising:
a plurality of amplifiers that are respectively connected to the plurality of voltage control lines in a one-to-one correspondence, wherein each amplifier in the plurality of amplifiers is configured to read the feedback information received by a correspondingly connected voltage control line.

7. The magnetic random access memory of claim 1, wherein:
the first bit line, the second bit line, and a corresponding electrode line are in parallel with each other, the first bit line is perpendicular to the plurality of voltage control lines, the second bit line is perpendicular to the plurality of voltage control lines, the first bit line is connected to a first end of the corresponding electrode line by using a first metal conducting wire, and the second bit line is connected to a second end of the corresponding electrode line by using a second metal conducting wire.

8. The magnetic random access memory of claim 7, wherein:
when data is written into the magnetic random access memory,
a write voltage is applied to the first bit line, and the second bit line is grounded; or
the first bit line is grounded, and the write voltage is applied to the second bit line; and
a first bias voltage is applied to a voltage control line in the plurality of voltage control lines that is connected to a storage unit into which the data is to be written, a second bias voltage is applied to a voltage control line in the plurality of voltage control lines that is connected to a storage unit into which the data is not to be written, and the first bias voltage is unequal to the second bias voltage.

9. The magnetic random access memory of claim 7, wherein:
when data is read from the magnetic random access memory,
each of the plurality of voltage control lines is configured to apply a read voltage or a read current to a correspondingly connected storage unit, and receive feedback information of the correspondingly connected storage unit; and
the feedback information indicates data stored in the correspondingly connected storage unit.

10. The magnetic random access memory of claim 9, further comprising:
a plurality of amplifiers that are respectively connected to the plurality of voltage control lines in a one-to-one correspondence, wherein each amplifier in the plurality of amplifiers is configured to read the feedback information received by a correspondingly connected voltage control line.

11. The magnetic random access memory of claim 1, wherein each magnetic tunnel junction comprises a free layer, a potential barrier layer, and a reference layer that are stacked in sequence, the free layer is connected to a corresponding electrode line, and the reference layer is connected to a voltage control line.

12. The magnetic random access memory of claim 1, wherein:
when data is written to the magnetic random access memory,
an electrode line is configured to provide a write current for a plurality of storage units connected to the electrode line, and
each of the plurality of voltage control lines is configured to provide a bias voltage for the plurality of storage units connected to the electrode line.

13. The magnetic random access memory of claim 1, wherein:
when data is read from the magnetic random access memory,
an electrode line is configured to provide a ground circuit for a plurality of storage units connected to the electrode line, and
each of the plurality of voltage control lines is configured to provide a read voltage or a read current for the plurality of storage units connected to the electrode line.

14. The magnetic random access memory of claim 1, wherein a resistance value of each magnetic tunnel junction is greater than or equal to 100 KΩ.

15. An electronic device, comprising:
at least one processor; and
a magnetic random access memory, wherein the magnetic random access memory is coupled to the at least one processor, and wherein the magnetic random access memory comprises:
a plurality of structural units, wherein each structural unit of the plurality of structural units comprises a multi-layer storage structure comprising a plurality of layers that are stacked in sequence, wherein each of the plurality of layers of the multi-layer storage structure comprises an electrode line and a plurality of storage units disposed on the electrode line, and wherein each of the plurality of storage units comprises a magnetic tunnel junction;
a first bit line and a second bit line, wherein the first bit line is connected to a first end of a corresponding electrode line, and the second bit line is connected to a second end of the corresponding electrode line; and
a plurality of voltage control lines,
wherein a first end of each of the plurality of storage units is connected to a corresponding electrode line, and a second end of each of the plurality of storage units is connected to one of the plurality of voltage control lines.

16. The electronic device of claim 15, wherein the plurality of voltage control lines are in parallel with each other, wherein planes in which the plurality of structural units are located are in parallel with each other, and wherein a plane in which each of the plurality of structural units is located is perpendicular to the plurality of voltage control lines.

17. The electronic device of claim 15, wherein:
the first bit line, the second bit line, and the plurality of voltage control lines are in parallel with each other; and
each structural unit further comprises a word line, a first transistor, and a second transistor,
wherein gates of the first transistor and the second transistor in each structural unit are separately connected to a corresponding word line, a source of the first transistor is connected to the first bit line, a drain of the second transistor is connected to the second bit line, a drain of the first transistor is connected to a first end of a corresponding electrode line by using a first metal conducting wire, and a source of the second transistor is connected to a second end of the corresponding electrode line by using a second metal conducting wire.

18. The electronic device of claim 17, wherein:
when data is written into the magnetic random access memory,
a gate bias voltage is separately applied to the first transistor and the second transistor in each structural unit through the corresponding word line;
a write voltage is applied to the first bit line, and the second bit line is grounded; and
a first bias voltage is applied to a voltage control line in the plurality of voltage control lines that is connected to a storage unit into which the data is to be written, a second bias voltage is applied to a voltage control line in the plurality of voltage control lines that is connected to a storage unit into which the data is not to be written, and the first bias voltage is unequal to the second bias voltage.

19. The electronic device of claim 17, wherein:
when data is read from the magnetic random access memory,
a gate bias voltage is separately applied to the first transistor and the second transistor in each structural unit through the corresponding word line; and
each of the plurality of voltage control lines is configured to apply a read voltage or a read current to a correspondingly connected storage unit, and receive feedback information of the correspondingly connected storage unit, wherein the feedback information indicates data stored in the correspondingly connected storage unit.

20. The electronic device of claim 19, wherein the magnetic random access memory further comprises:
a plurality of amplifiers that are respectively connected to the plurality of voltage control lines in a one-to-one correspondence, wherein each amplifier in the plurality of amplifiers is configured to read the feedback information received by a correspondingly connected voltage control line.

* * * * *